United States Patent [19]

Camsell et al.

[11] Patent Number: 5,333,373
[45] Date of Patent: Aug. 2, 1994

[54] SOCKET INSERTION TOOL HAVING INDEXABLE SOCKET GUIDE

[75] Inventors: Edwin Camsell, Harrisburg; Leo V. Schuppert, Jr., York; Kerry J. Stakem, Hummelstown, all of Pa.

[73] Assignee: The Whitaker Corporation, Wilmington, Del.

[21] Appl. No.: 135,608

[22] Filed: Oct. 12, 1993

[51] Int. Cl.$^5$ .................................... H05K 13/04
[52] U.S. Cl. .................................. 29/739; 29/845
[58] Field of Search ............ 29/739, 747, 758, 809, 29/845, 842

[56] References Cited

U.S. PATENT DOCUMENTS 4,914,811  4/1993  Nolte, Jr. ........................... 29/747

OTHER PUBLICATIONS

AMP Incorporated Data Sheet 81-645 "Miniature Spring Socket on Polyester Strip", Revised Aug. 1983, pp. 1-3.

*Primary Examiner*—Carl E. Hall
*Attorney, Agent, or Firm*—Robert J. Kapalka

[57] ABSTRACT

A tool for inserting electrical sockets (4) mounted on a carrier strip (2) into holes in a circuit board (80) has a socket guide (14) which is indexable to accommodate different sockets each having one of several possible known lengths. The tool includes a body (12) and a carrier strip advancing mechanism (42, 44, 46) operable on the carrier strip to feed the sockets to a feed station (52) in a vertical orientation. A ram (20) is movable through the feed station along a path between a first position above the feed station and a second position below the feed station to drive one of the sockets from the carrier strip to an insertion station. A guide tube (24) connected to the body below the feed station defines a tubular bore (26) through which the ram passes for guiding the socket driven by the ram from the carrier strip to the insertion station. The socket guide (14) is disposed between the feed station and the guide tube and guides the socket driven by the ram from the feed station to the guide tube. The socket guide has several portions each having an upwardly facing surface (17) defining a plane and a guide hole (18) extending through the socket guide perpendicular to the plane.

9 Claims, 10 Drawing Sheets

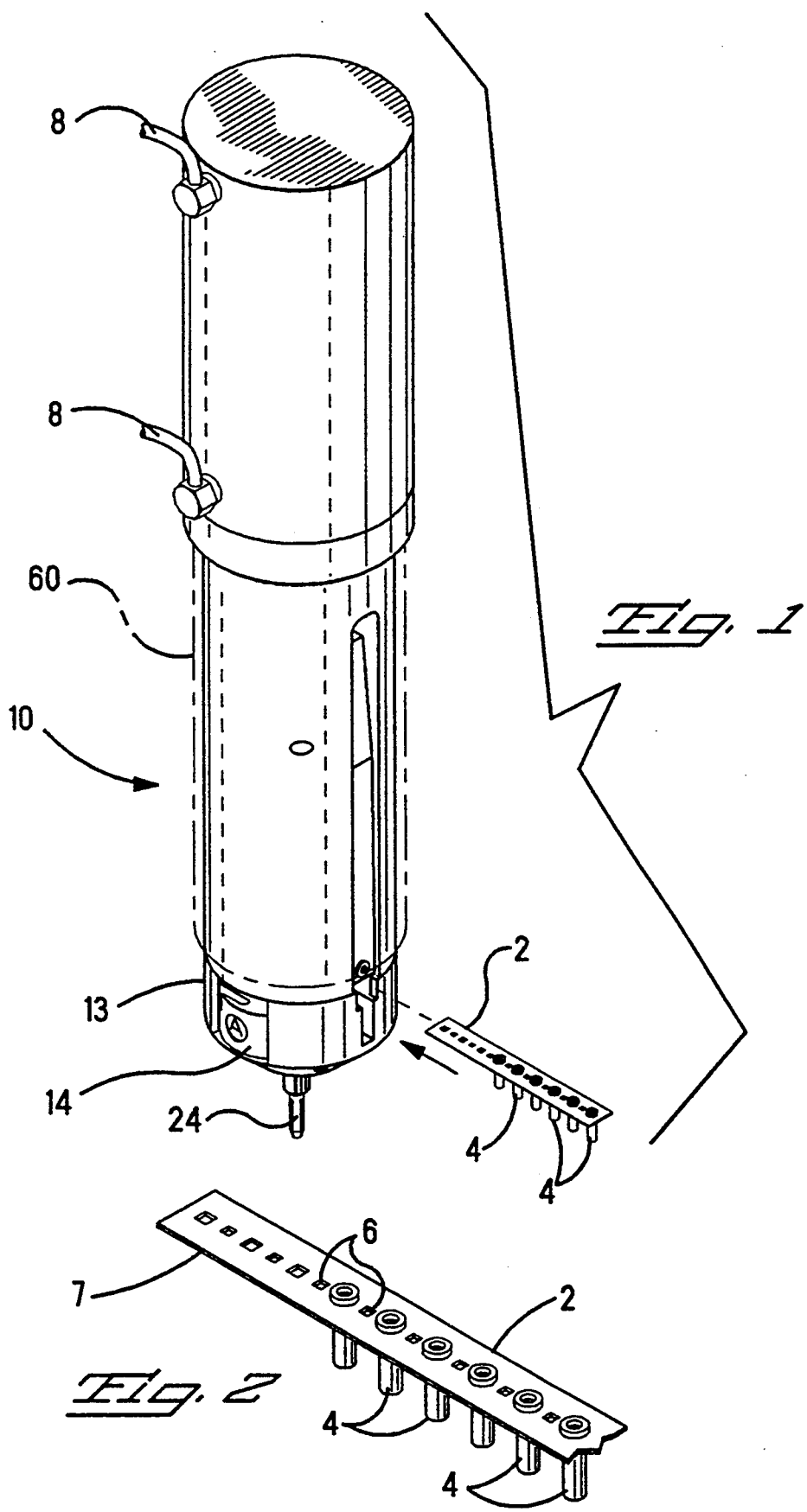

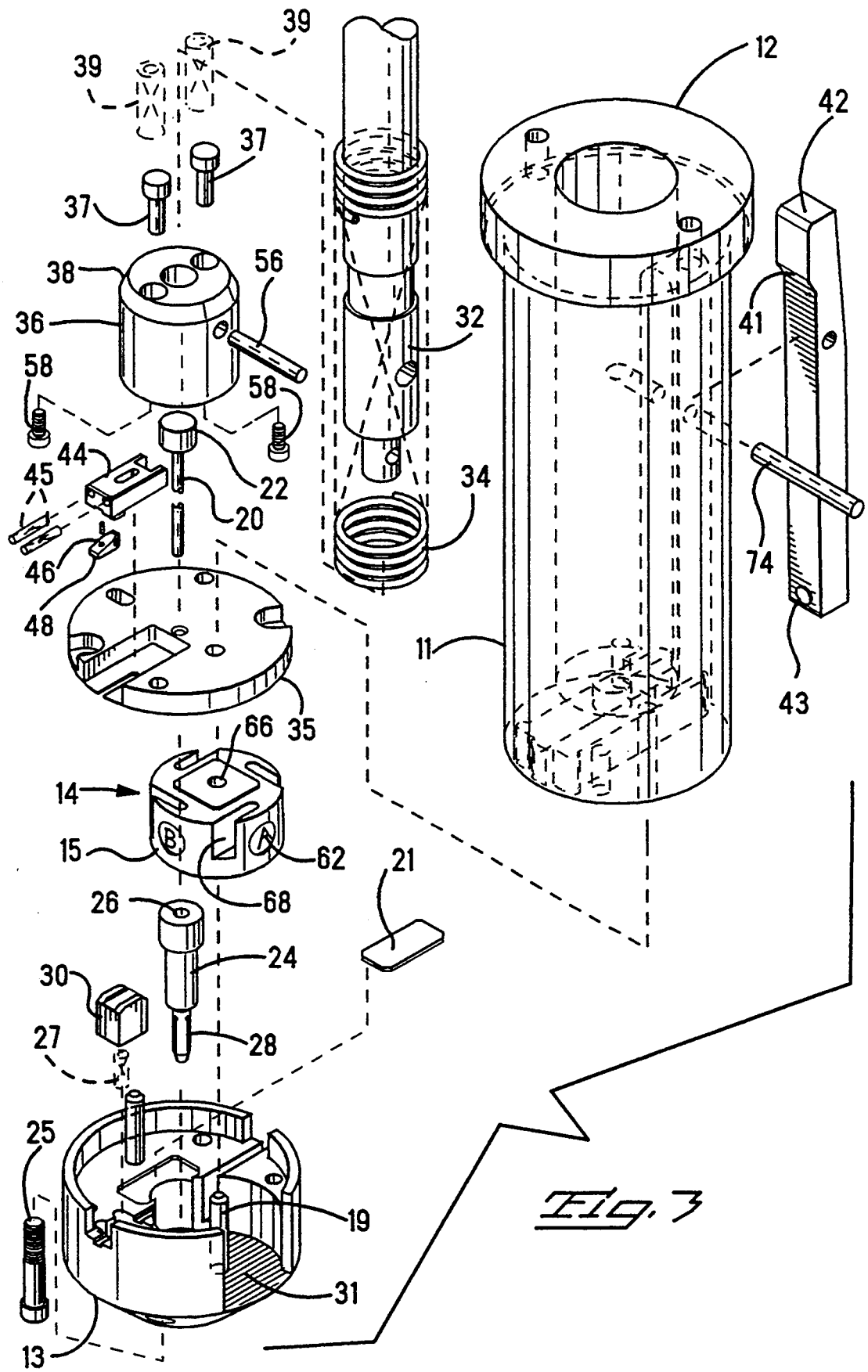

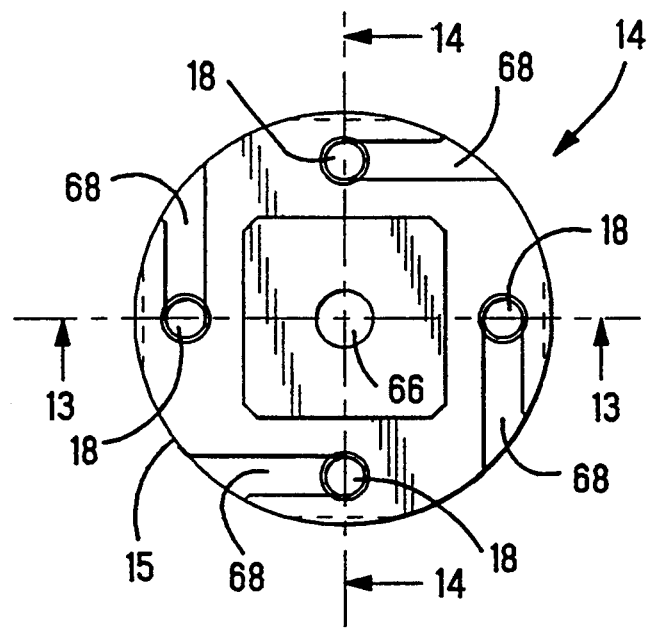
_Fig. 12_
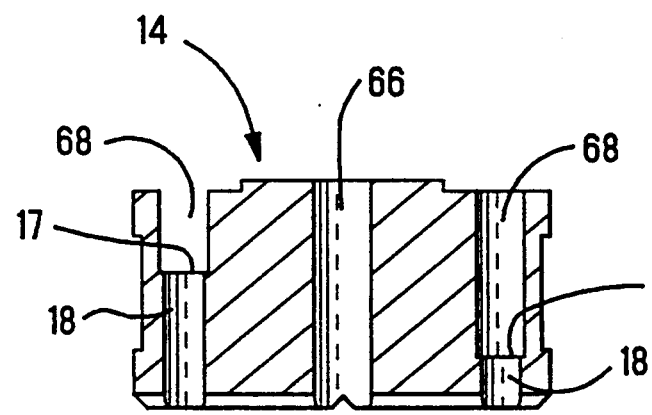
_Fig. 13_
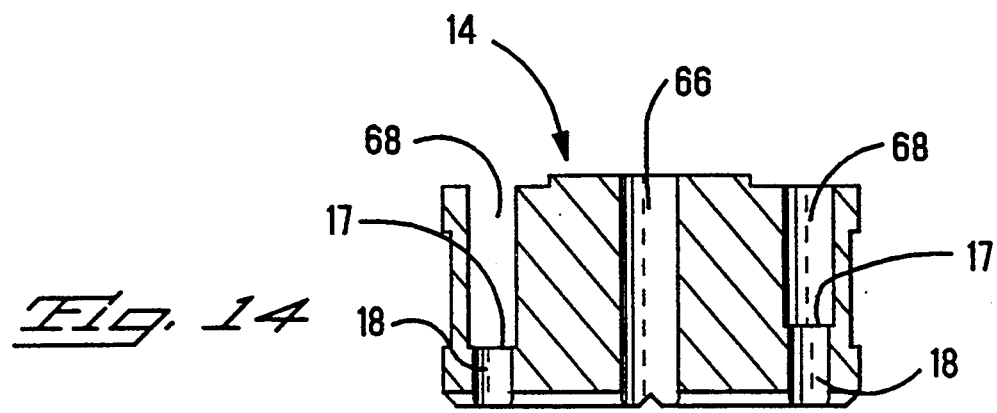
_Fig. 14_

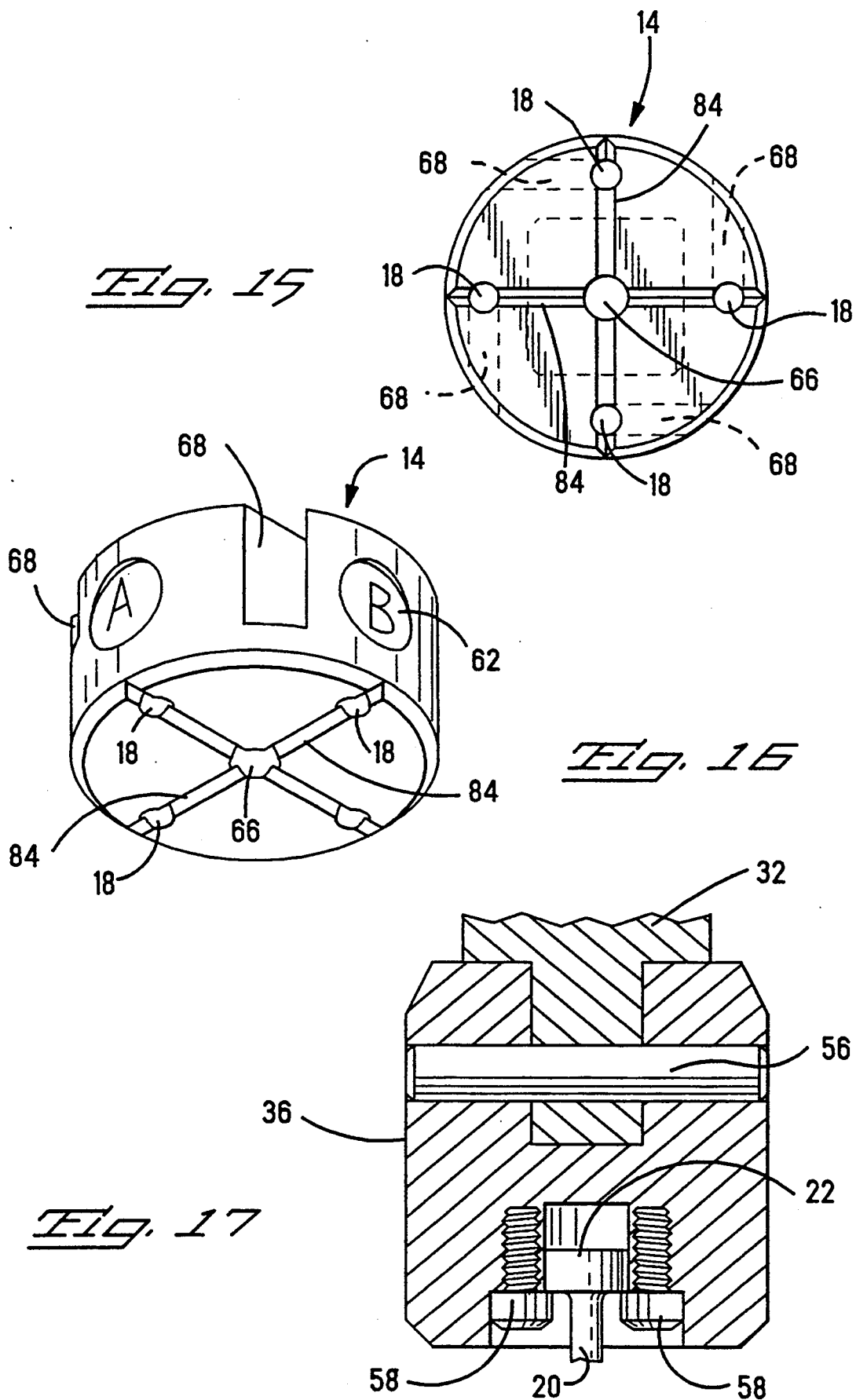

SOCKET INSERTION TOOL HAVING INDEXABLE SOCKET GUIDE

FIELD OF THE INVENTION

The invention relates to a tool having a reciprocating ram for driving sockets from a carrier strip into holes in a circuit board, wherein the tool has a socket guide which is indexable to permit the tool to work with sockets having different lengths.

BACKGROUND OF THE INVENTION

Miniature spring sockets such as those sold by AMP, Incorporated, of Harrisburg, Pennsylvania under AMP Part No. 331677 comprise a resilient spring contact within an exterior sleeve. These sockets are especially suitable for insertion in a printed circuit board wherein leads of appropriate circuit board elements are subsequently inserted in the sockets. A hand tool for inserting the sockets in circuit boards is sold under AMP Part No. 59940. The sockets are supplied to the tool on a carrier strip which is a plastic ribbon having the sockets mounted at intervals therealong. The ribbon includes a series of apertures, and the tool has an advancing mechanism which serially engages in the apertures for feeding the carrier strip through the tool. The tool includes a reciprocating ram which drives the sockets from the carrier strip and through a tubular inserter which guides the sockets to the tool tip for insertion in the circuit board.

These miniature spring sockets are available in different series which differ in outer dimension for reception in different size holes in the circuit board. Within each series the sockets are available in different lengths to accommodate different board thicknesses and different circuit board elements. Heretofore, the insertion tool was especially adapted to work with a particular length socket of a particular series, and a different tool was required for each different series and length of socket. There has been a need for a socket insertion tool which could easily be converted to work with a series of miniature spring sockets having different lengths. There has also been a need for a socket insertion tool which could easily be converted to accommodate several different series of sockets having different diameters.

SUMMARY OF THE INVENTION

The present invention provides a tool for inserting electrical sockets mounted on a carrier strip into holes in a circuit board, wherein the sockets may have one of several possible known lengths. The tool comprises a tool body which defines a carrier strip feed track and a feed station along the feed track. An advancing mechanism is operable on the carrier strip to feed the sockets along the feed track such that the sockets are fed successively to the feed station in a vertical orientation. A ram is mounted to the tool body for movement through the feed station along a path between a first position above the feed station and a second position below the feed station. During a downward stroke of the ram, one of the sockets of given length in the feed station is driven from the carrier strip to an insertion station. A guide tube is connected to the body below the feed station. The guide tube defines a tubular bore through which the ram passes for guiding the socket which is driven by the ram from the carrier strip to the insertion station. A socket guide is disposed between the feed station and the guide tube for guiding the one socket between the feed station and the guide tube. The socket guide has several portions each associated with a respective one of the possible known lengths of sockets. Each of the portions of the socket guide has an upwardly facing surface which defines a plane. A guide hole extends through each of the portions perpendicular to the plane. The socket guide is indexable to move a selected one of the portions such that its respective guide hole is aligned with the path of the ram and the plane of its respective upwardly facing surface is immediately below the lowermost end of the one socket. When the selected portion is indexed as above-described, the guide hole of the selected portion receives the lowermost end of the socket upon engagement of the socket by the ram, and immediately constrains the lowermost end against horizontal movement such that the socket remains vertically aligned prior to entering the inserter.

According to another aspect of the invention, the socket guide may be replaced with a different socket guide selected from a group of socket guides which differ in that their guide holes have different diameters to accommodate different sizes of sockets.

According to another aspect of the invention, the socket guide is disposed within a removable nose of the tool, and the nose is replaceable as an assembly.

BRIEF DESCRIPTION OF THE DRAWINGS

There are shown in the drawings the embodiments of the invention that are presently preferred. It should be understood, however, that the invention is not limited to the precise arrangements and instrumentalities shown in the drawings, wherein:

FIG. 1 is a perspective view of an insertion tool according to the invention, and a carrier strip having sockets which can be acted upon by the tool.

FIG. 2 is an enlarged perspective view of the carrier strip and sockets which can be acted upon by the tool.

FIG. 3 is an exploded perspective view showing internal components of the tool.

FIG. 8 is a cross-sectional view through the tool showing the socket disposed in a circuit board after having been driven by the ram from the insertion station into the circuit board.

FIG. 12 is a top view of an indexable socket guide.

FIG. 13 is a cross-sectional view taken along line 13—13 of FIG. 12.

FIG. 14 is a cross-sectional view taken along line 14—14 of FIG. 12.

FIG. 15 is a bottom view of the socket guide.

FIG. 16 is a bottom perspective view of the socket guide.

FIG. 17 is a cross-sectional view taken along line 17—17 of FIG. 4, showing a connection of the ram to an actuating cylinder.

DETAILED DESCRIPTION OF THE PREFERRED EMBODIMENT

Figure 4:
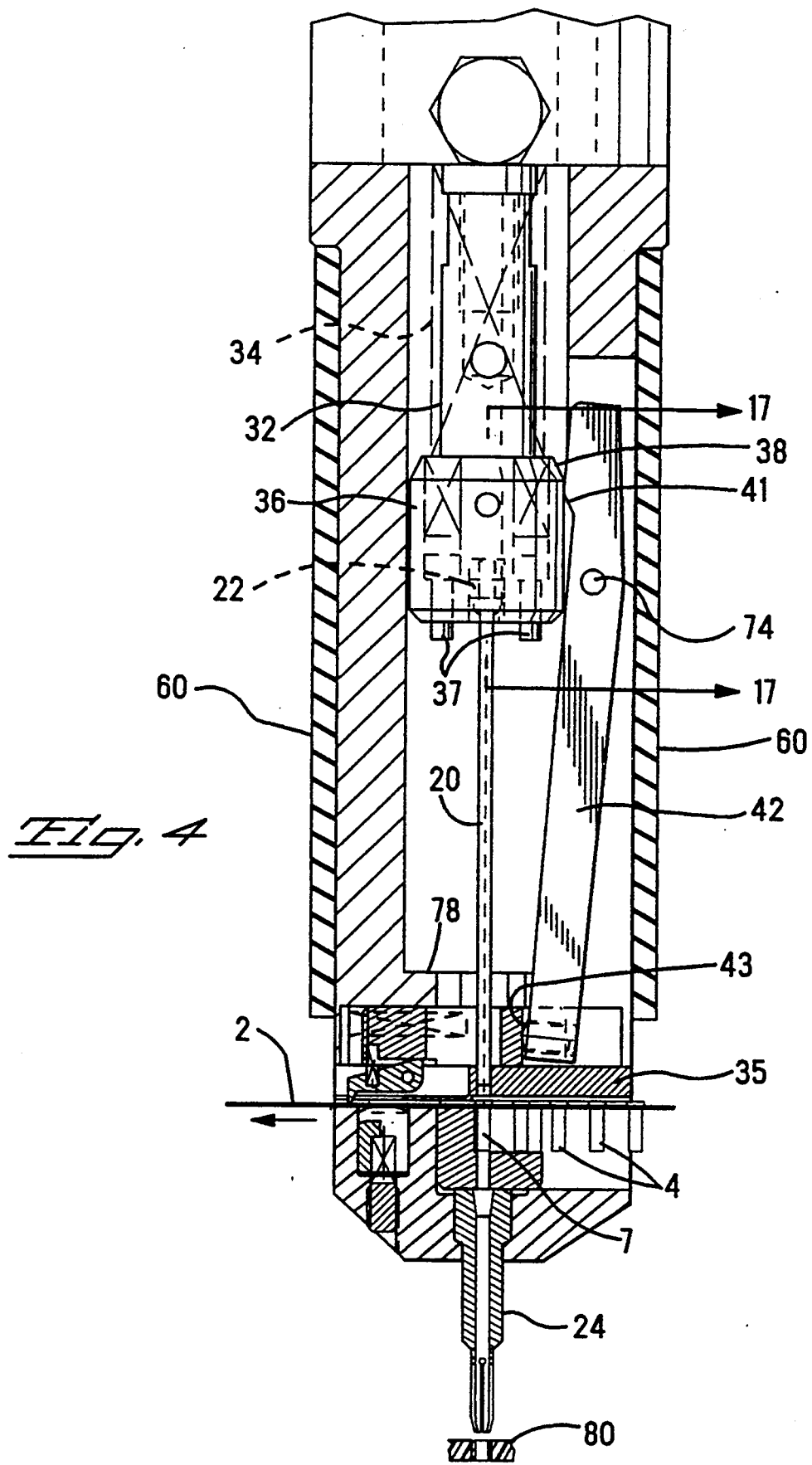
FIG. 4 is cross-sectional view through the tool, showing a socket in a feed station and a ram in a first position above the feed station.

An overall view of an insertion tool 10 according to the invention is shown in FIG. 1, along with a carrier strip 2 having sockets 4 which can be acted upon by the tool 10. The tool 10 is normally hand held by an operator, but the present invention could be easily incorporated in automatic machinery for inserting sockets in circuit boards. The tool 10 is pneumatically actuated via pressure forces received through hose 8, although other sources of energy such as electric or hydraulic energy could be utilized to actuate the tool.

The carrier strip 2 is a length of Mylar or other suitable plastic support strip. As shown more clearly in FIG. 2, the sockets 4 are mounted at regular spaced intervals along the carrier strip 2, and feed holes 6 are disposed alternately with the sockets 4 along the length of the carrier strip 2. The feed holes 6 are sequentially engageable by an advancing mechanism within the tool 10 to feed the carrier strip, and thus the sockets 4, along a feed track through the tool. The carrier strip may include a leader portion 7 which is devoid of the sockets 4 along a short length, this length being initially insertable in the tool to the vicinity of the advancing mechanism so that the carrier strip will be automatically advanceable immediately upon loading into the tool, as will be more fully described hereinafter.

Figure 5:
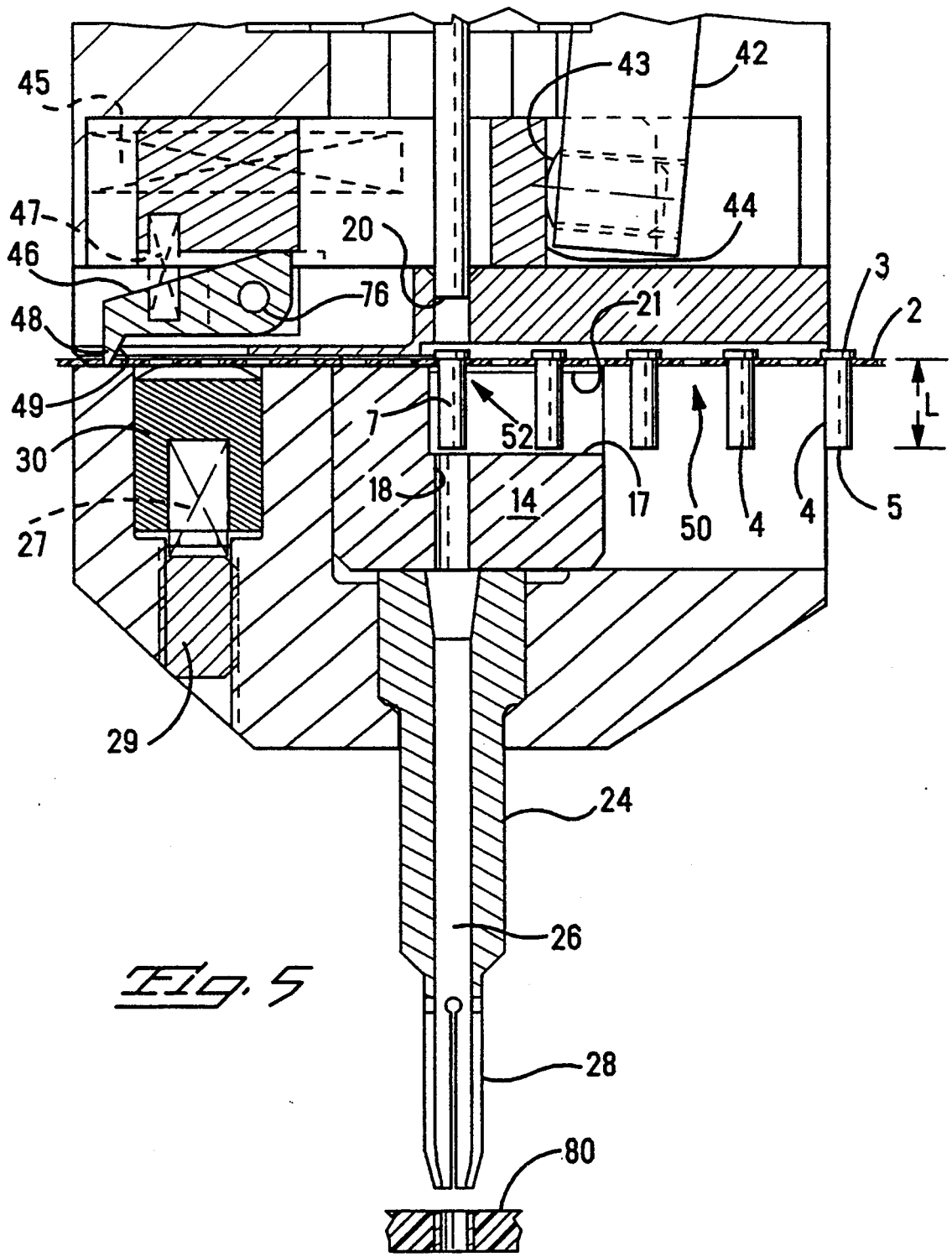
FIG. 5 is an enlarged view of a lower portion of FIG. 4.

Referring now to FIGS. 4 and 5, the sockets 4 are metallic members which are to be inserted by the tool 10 into holes in a circuit board 80. Each of the sockets has a length L which extends from head 3 to lowermost end 5 of the socket 4, the length L being one of several possible known standard lengths in which the sockets 4 are manufactured and available. The tool 10 according to the invention has adjustable means for enabling the tool to effectively handle and insert different sockets having different lengths L as may be required by the thickness of the circuit board into which the socket will be inserted. The sockets 4 are also available in different "series" which differ in external diameter. According to another aspect of the invention, the tool 10 has a removable nose assembly which may be selected from a group of nose assemblies to enable the tool to handle different ones of the series of sockets.

Referring now to FIGS. 3–7, the tool 10 comprises a tool body 12 which houses an actuating cylinder assembly 32, extension spring 34, and cylinder stop 36. The cylinder stop 36 is connected to one end of the cylinder assembly 32 by spring pin 56. The cylinder assembly 32 receives pneumatic forces through the hose 8 (shown in FIG. 1), application of the pneumatic forces being controlled by an operator through foot actuated switches. The hose 8 includes two ducts separately connected to the cylinder assembly 32 so as to enable pressurization of the cylinder assembly on opposite sides of an internal piston so that the cylinder assembly may be extended and retracted. Then in an unpressurized condition, the cylinder assembly 32 is biased to a position shown in FIG. 6 by the spring 34 acting downwardly on the cylinder stop 36.

The carrier strip 2 having the sockets 4 mounted thereon is moved through the tool by an advancing mechanism including feed arm 42, feed slide 44, and feed finger 46. The carrier strip 2 is moved along a feed track 50 defined by the body 12, and the sockets 4 are fed successively to a feed station 52. A ram 20 is mounted to the body 12 for movement through the feed station 52 to drive one of the sockets 4 which is in the feed station 52 into the circuit board. In the preferred embodiment shown, the faun 20 is an elongated member having a head 22 which is received within a central bore of the cylinder stop 36. As shown in cross-section in FIG. 17, the ram 20 is coupled to the cylinder stop 36 by two screws 58 which are engaged in threaded holes in the cylinder stop 36, heads of the screws 58 extending beneath the head 22 of the ram.

Figure 6:
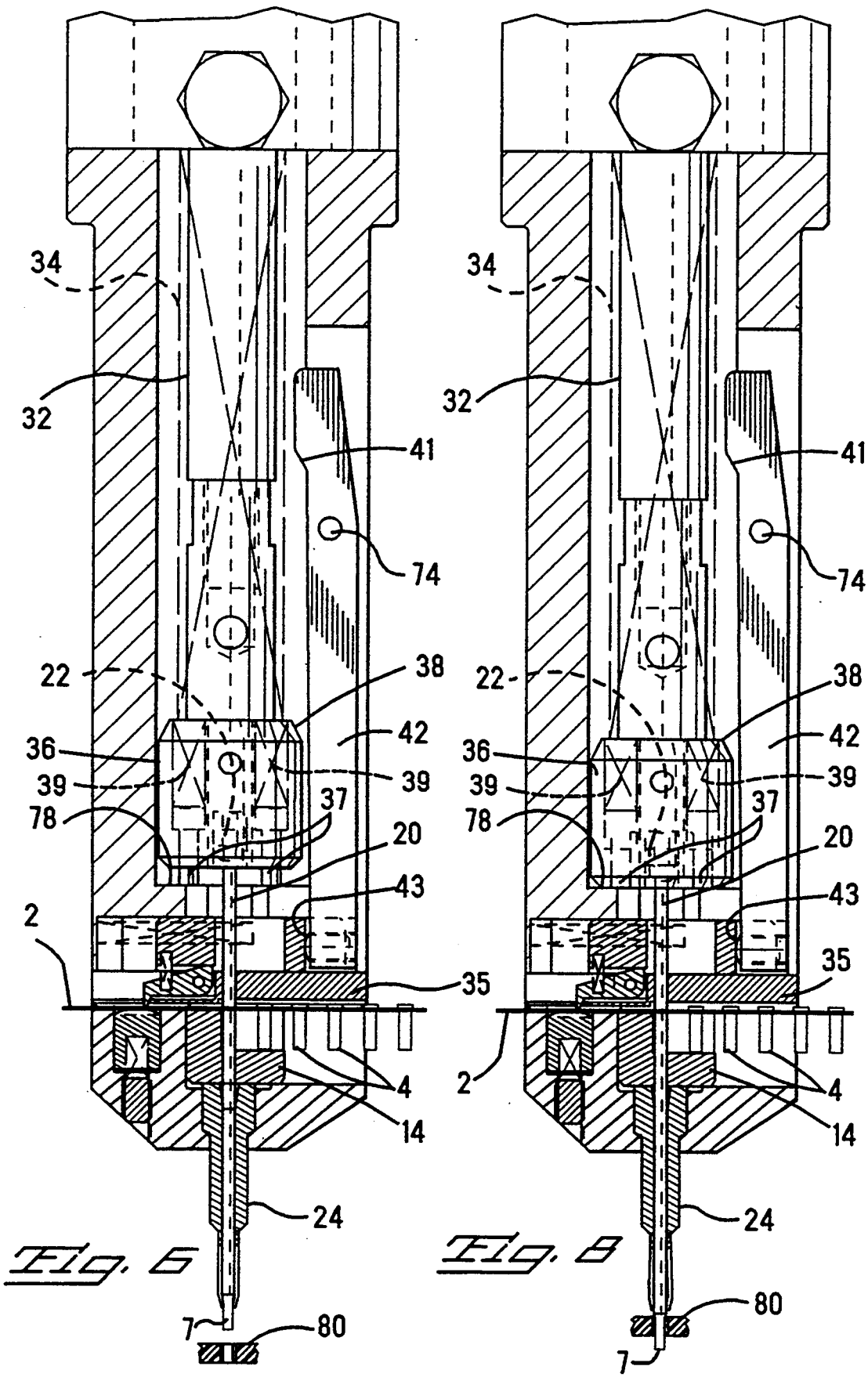
FIG. 6 is a cross-sectional view through the tool showing the ram in a second position after having driven the socket from the feed station to an insertion station.
Figure 7:
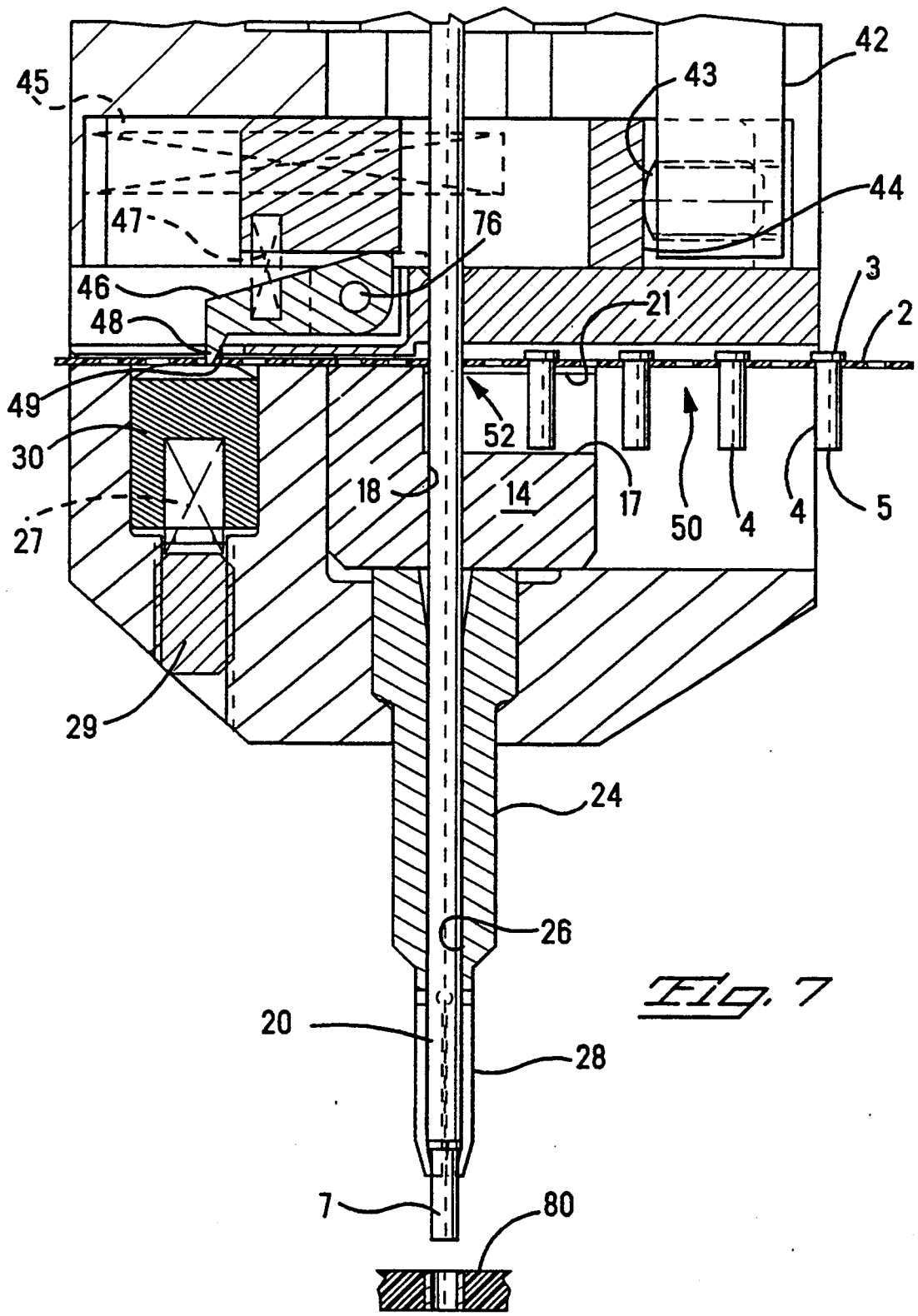
FIG. 7 is an enlarged view of a lower portion of FIG. 6.

Prior to initiating a socket insertion operation, a carrier strip 2 having sockets 4 of selected known length must be introduced to the tool. Since the ram 20 normally extends through the feed station 52 when the cylinder assembly 32 is unpressurized as shown in FIGS. 6 and 7, the operator must activate a first switch (not shown) to pressurize the cylinder assembly 32 and draw the ram 20 upwardly against the bias of the spring 34 to a first position above the feed station 52, as shown in FIGS. 4 and 5. The cylinder assembly 32 remains pressurized, and the re 20 remains in the first position, as long as the first switch remains activated. The operator can then insert the carrier strip having the sockets 4 along the feed track 50 until a first one 7 of the sockets 4 is in the feed station 52. When the operator deactivates the first switch, the cylinder assembly 32 is depressurized and the ram 20 is driven downwardly by the spring 34. The ram 20 moves along a path through the feed station 52 to a second position below the feed station, and simultaneously drives the one socket 7 which was in the feed station from the carrier strip. A backing plate 21 is disposed in an area of the feed station 52 beneath the carrier strip 2 to provide support for the carrier strip 2 as the one socket 7 is driven therefrom.

During upward movement of the cylinder stop 36, a beveled edge 38 of the stop 36 contacts actuating portion 41 of the feed arm 42, thus pivoting the feed arm 42 about pin 74. A tip 43 of the feed arm 42 urges the feed slide 44 leftwardly as shown in the drawings, and simultaneously urges the feed finger 46 leftwardly. The feed finger 46 is pivotally connected to the feed slide 44 by pin 76, and weak spring 47 urges the feed finger 46 downwardly. A projection 48 of the feed finger 46 engages in one of the feed holes 6 in the carrier strip 2 and advances the carrier strip through the tool. Upon downward movement of the cylinder stop 36, springs 45 urge the feed slide 44 to retract. The projection 48 is lifted out of the feed hole 6 against the bias of the weak spring 47 by a side of the feed hole 6 acting against beveled face 49, and the projection 48 is dragged along the carrier strip 2 until the advancing mechanism is fully retracted, the projection 48 then engaging in a next one of the feed holes 6 and being ready for a next advance stroke.

A drag 30 is urged by spring 27 against the carrier strip 2 to maintain tension on the carrier strip and support the carrier strip beneath the feed finger 46. Means for adjusting a biasing force of the spring 27 may be provided such as by setscrew 29.

A guide tube 24 is connected to the body below the feed station 52. The guide tube includes a tubular bore 26 through which the ram 20 passes. After the ram 20 has driven the one socket 7 from the carrier strip 2 during a downward ram stroke, the driven socket is urged by the ram through the tubular bore 26 to a collet portion 28 of the guide tube 24 at an end thereof. The collet portion 28 includes radially expandable fingers which are configured to grip the head 3 of the one socket 7. When the ram is in its second position, the one socket extends from the tip of the collet portion 28, as shown in FIGS. 6 and 7. The collet portion 28 thus provides an insertion station wherein the one socket 7 is temporarily held exposed at a tip of the insertion tool.

Contact pins 37 are slidably disposed in the cylinder stop 36 and are backed by springs 39. Ends of the contact pins 37 extend through a bottom surface of the cylinder stop 36 and contact interior surface 78 of the body 12 when the ram 20 is in the second, at rest, position. The springs 39 provide a resilient cushion which absorbs kinetic energy as the ram 20 approaches the second position so that inertia of the ram does not expel the one socket 7 beyond the insertion station at the tip of the collet portion 28.

Figure 9:
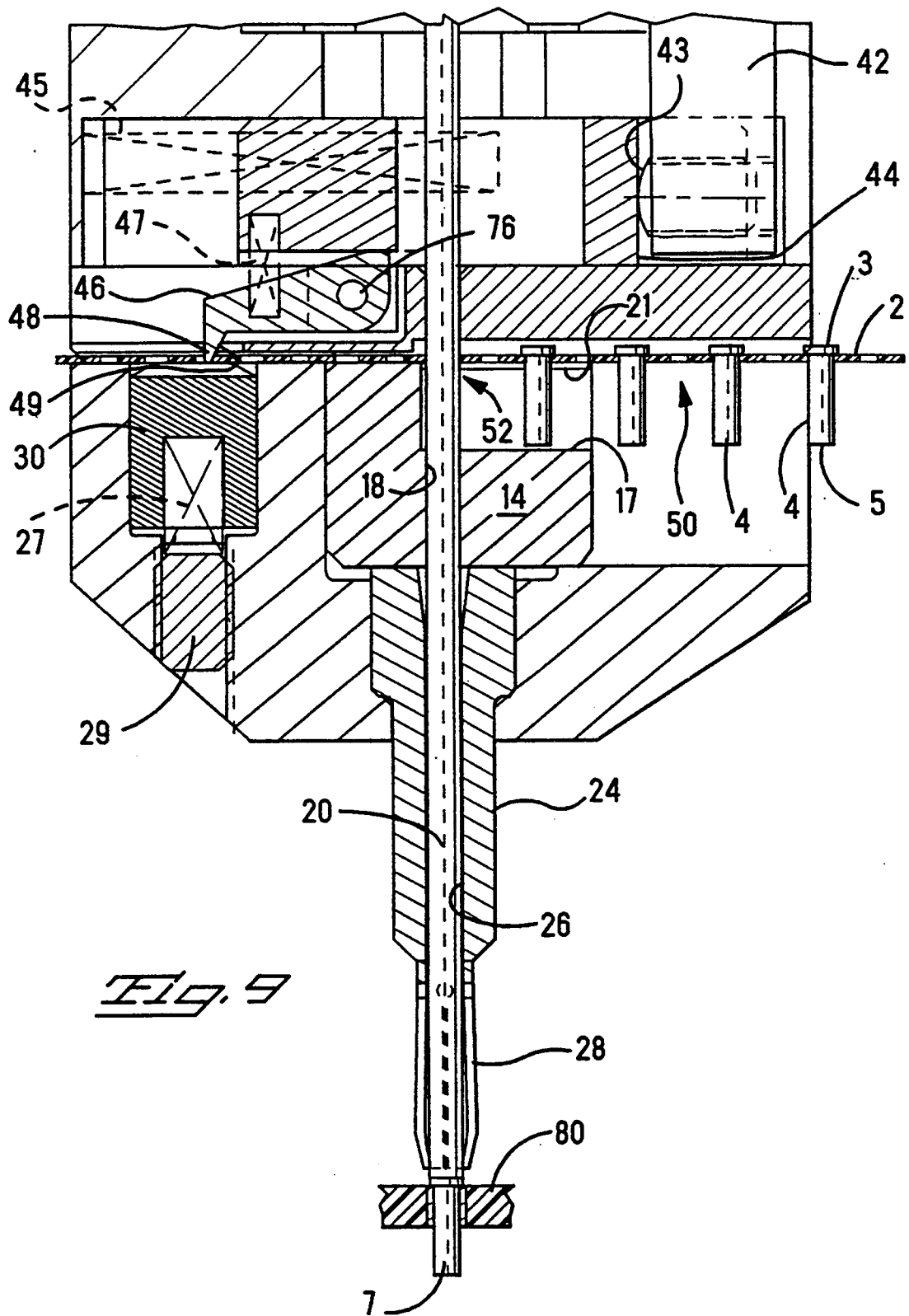
FIG. 9 is an enlarged view of a lower portion of FIG. 8.

The one socket 7 is now primed at the tip of the insertion tool and is ready for introduction into a hole in the circuit board 80. When the tool 10 is a hand tool as shown in the drawings, the tool operator brings the tool 10 to the circuit board 80 and partially inserts the one socket 7 which is disposed at the insertion station into the hole of the circuit board. The operator then activates a second switch (not shown) to oppositely pressurize the cylinder assembly 32 so that the ram 20 is driven further downwardly to expel the socket from the insertion station and fully seat the socket in the circuit board, as shown in FIGS. 8 and 9. After this ram movement, appropriate control means automatically redirect pneumatic forces to again pressurize the cylinder assembly 32 to retract the ram to the first position, shown in FIG. 4, against the bias of the spring 34. The cylinder stop 36 again contacts the actuating portion 41 of the feed am 42 and initiates operation of the carrier strip advancing mechanism as previously described, thereby advancing the carrier strip 2 by an additional increment and feeding a next one of the sockets 4 to the feed station 52. A bleed valve (not shown) then releases pressure from the cylinder assembly 32, whereby the ram 20 is again driven downwardly by the spring 34 to the second position, shown in FIG. 6, and the next socket is driven from the carrier strip to the insertion station. The above-described cyclic process of the ram driving the socket from the insertion station into the circuit board, the ram retracting, the carrier strip being advanced, and the next socket being driven by the ram from the carrier strip to the insertion station, is all initiated by a single input of the operator in activating the second switch. Thus, the tool according to the invention is a single action tool which requires only one input from the operator during each complete cycle.

The tool further includes a socket guide 14 disposed between the feed station 52 and the guide tube 24 for guiding the one socket 4 between the feed station and the guide tube. The socket guide 14 has several portions each associated with a respective one of the possible known lengths of the sockets 4. Each of the portions of the socket guide 14 has an upwardly facing surface 17 defining a plane. A guide hole 18 extends through each of the portions perpendicular to the plane of its respective surface 17. The socket guide 14 is indexable to move a selected one of the portions such that its respective guide hole 18 is aligned with the path of the ram 20, and the plane defined by its respective surface 17 is immediately below the lowermost end of the one socket 7 in the feed station 52. When the ram 20 is driven to engage the one socket 7, the guide hole 18 receives the lowermost end of the socket and immediately constrains the lowermost end against horizontal movement so that the socket remains vertically aligned prior to entering the guide tube 24.

A preferred embodiment for the socket guide 14 is shown in detail FIGS. 12–16. The socket guide is rotatably mounted on pin 19 (shown in FIG. 3) which extends through central bore 66, portions of the socket guide being defined by angular segments thereof. The pin 19 is parallel to and laterally offset from the path of the ram 20. Several slots 68 extend into the socket guide, one of the slots 68 being associated with each of the portions. Each of the slots 68 extends from an outer peripheral surface 15 along a line tangent to a circle which is concentric with the bore 66. A bottom surface of each slot serves as the upwardly facing surface 17 for its respective portion of the socket guide. Depths of the slots are preselected so that, as the socket guide is rotated on its axis, the surfaces are sequentially disposed in planes which are immediately below potential locations of the lowermost ends for the several possible known lengths of the sockets 4.

Guide holes 18 are disposed concentrically around the central bore 66 at the ends of the slots 68. Each of the guide holes has a diameter selected to closely encompass a particular socket diameter. In the preferred embodiment, the socket guide 14 has all of the guide holes 18 of a same diameter which is selected to closely encompass the sockets in a particular "series" of sockets which differ only in length, and different ones of the socket guides 14 have guide holes 18 of different diameters. However, the invention could include the socket guide 14 having the guide holes 18 which differ in diameter.

Figure 10:
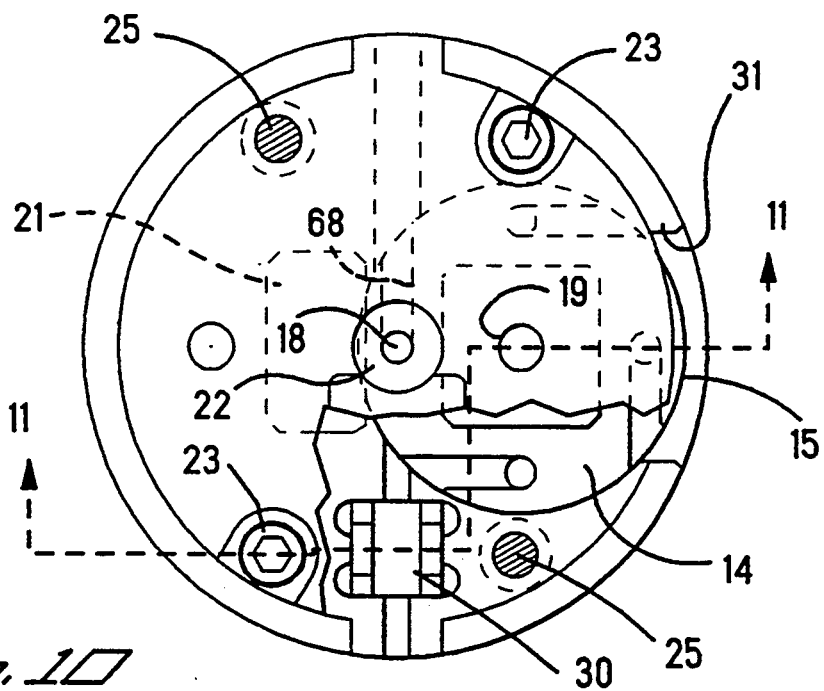
FIG. 10 is a top view of a replaceable nose assembly for the tool according to the invention.
Figure 11:
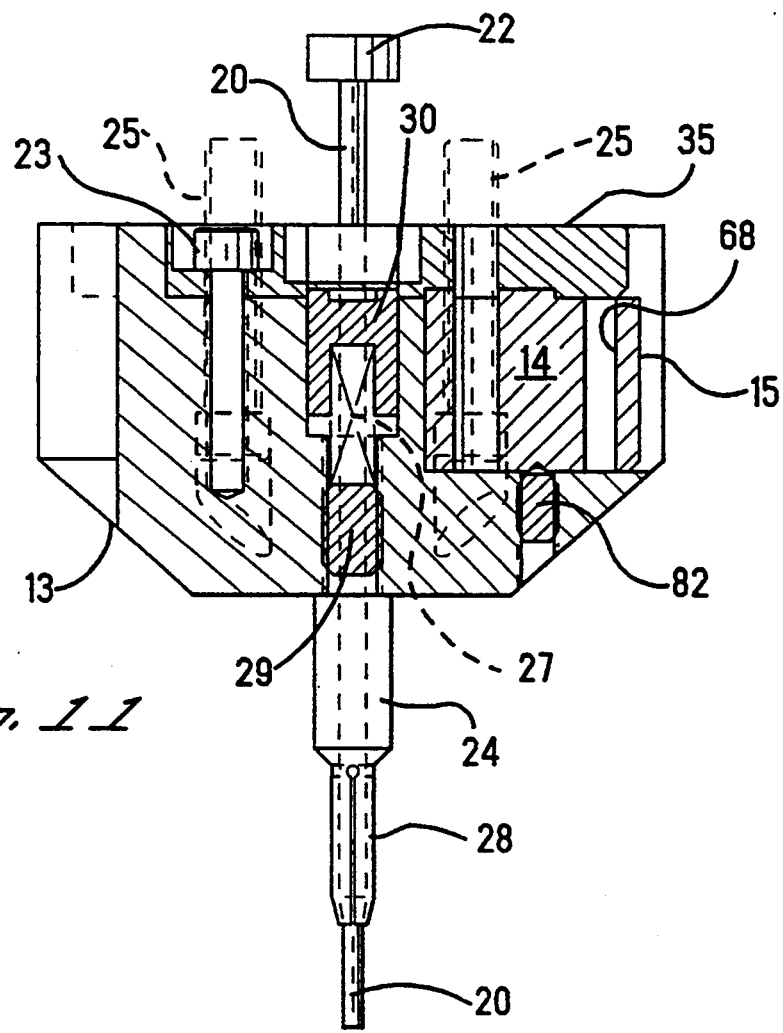
FIG. 11 is a cross-sectional view taken along line 11—11 of FIG. 10.

As shown in FIGS. 3, 10 and 11, the tool body 12 preferably includes a main body 11 and a removable nose 13 attached to the main body 11 such as by threaded fasteners 25. The socket guide 14 is disposed in the removable nose 13 below a retainer plate 35 which is secured by fasteners 23 to the nose 13. Peripheral surface 15 of the socket guide 14 is accessible through an opening 31 in the nose 13 to permit an operator to adjustably rotate the socket guide 14 on the pin 19. The peripheral surface 15 is preferably knurled to enhance the frictional characteristics thereof, and indicia 62 are preferably provided to identify the different portions which may be selected.

The tool operator selects the appropriate portion of the socket guide 14 according to the length of the sockets with which the tool is going to be used. Before inserting the carrier strip into the tool, the operator indexes the socket guide by rotating it around the pin 19 to select the slot having the surface 17 which will define a plane immediately below the anticipated location in the feed station 52 of the lowermost ends of the sockets that are carried on the carrier strip. Normally, the operator will accomplish this by referring to the indicia 62 and by rotating the socket guide to make visible one of the indicia 62 corresponding to the length of the sockets which will be operated upon by the tool. The socket guide is correctly indexed when its respective guide hole 18 is aligned with the path of the ram 20, and the plane of its respective surface 17 is immediately below the lowermost end of the one socket 7 in the feed station 52. A detent mechanism 82 releasably engages in grooves 84 (shown in FIG. 16) in the socket guide to assist the operator in correctly aligning the guide hole 18 with the ram 20.

According to the invention, the socket guide 14 may be replaced with a different socket guide selected from a group of socket guides which have guide holes 18 of different diameter to accommodate different series of the sockets 4. In a preferred embodiment, the nose 13 having the socket guide therein is removable and replaceable as an assembly be releasing the threaded fasteners 25.

As best shown in FIG. 4, a rubber sleeve 60 which surrounds the tool body 12 provides increased grip for a tool operator and protects against injury by enclosing the feed arm 42.

The invention having been disclosed, a number of variations will now become apparent to those skilled in the art. Whereas the invention is intended to encompass the foregoing preferred embodiments as well as a reasonable range of equivalents, reference should be made to the appended claims rather than the foregoing discussion of examples, in order to assess the scope of the invention in which exclusive rights are claimed.

We claim:

1. A tool for inserting electrical sockets mounted on a carrier strip into holes in a circuit board, each of the sockets having a length which extends to a lowermost end, each of the lengths being one of several possible known lengths, the tool comprising:

a tool body defining a carrier strip feed track and a feed station along the feed track;

an advancing mechanism operable on the carrier strip to feed the carrier strip along the feed track such that the sockets are fed successively to the feed station in a vertical orientation;

a ram mounted to the body for movement through the feed station along a path between a first position above the feed station and a second position below the feed station, wherein one of the sockets of given length in the feed station is driven from the carrier strip to an insertion station by a stroke of the ram moving from the first to the second position;

a guide tube connected to the body below the feed station, the guide tube defining a tubular bore through which the ram passes for guiding said one socket when driven by the ram from the carrier strip to the insertion station; and, a socket guide disposed between the feed station and the guide tube for guiding said one socket between the feed station and the guide tube, the socket guide having several portions each associated with a respective one of the possible known lengths, each of the portions having an upwardly facing surface defining a plane and a guide hole extending through each said portion perpendicular to the plane, the socket guide being indexable to move a selected one of said portions such that its respective guide hole is aligned with the path of the ram and the plane of its respective upwardly facing surface is immediately below the lowermost end of said one socket;

whereby the guide hole of the selected portion receives said lowermost end upon engagement of said one socket by the ram and immediately constrains said lowermost end against horizontal movement such that said one socket remains vertically aligned prior to entering the guide tube.

2. The tool according to claim 1, wherein the upwardly facing surfaces are disposed at different relative distances below the feed track.

3. The tool according to claim 1, wherein the upwardly facing surfaces are bottom surfaces of slots defined by the socket guide.

4. The tool according to claim 1, wherein the socket guide is rotatable about a rotation axis.

5. The tool according to claim 4, wherein the upwardly facing surfaces are disposed at different relative distances below the feed track.

6. The tool according to claim 4, wherein the rotation axis is parallel to and laterally offset from the ram path.

7. The tool according to claim 6, wherein the upwardly facing surfaces are bottom surfaces of slots defined by the socket guide.

8. The tool according to claim 1, wherein the socket guide is replaceable and selectable from among a series of socket guides which differ by a dimension of their respective guide holes.

9. The tool according to claim 1, wherein the tool body includes a replaceable nose assembly, the socket guide is disposed within the nose assembly, and the nose assembly is selectable from among a group of nose assemblies which differ by a dimension of the guide holes of their respective socket guides.

* * * * *